(12) United States Patent
Kienle et al.

(10) Patent No.: US 8,196,005 B2
(45) Date of Patent: Jun. 5, 2012

(54) METHOD AND DEVICE FOR DECODING LDPC ENCODED CODEWORDS WITH A FAST CONVERGENCE SPEED

(75) Inventors: Frank Kienle, Kirrweiler (DE); Norbert Wehn, Queidersbach (DE); Torben Brack, Kaiserslautern (DE)

(73) Assignee: STMicroelectronics N.V., Amsterdam (NL)

( * ) Notice: Subject to any disclaimer, the term of this patent is extended or adjusted under 35 U.S.C. 154(b) by 887 days.

(21) Appl. No.: 12/294,714

(22) PCT Filed: Mar. 28, 2007

(86) PCT No.: PCT/EP2007/052986
§ 371 (c)(1),
(2), (4) Date: Sep. 26, 2008

(87) PCT Pub. No.: WO2007/110436
PCT Pub. Date: Oct. 4, 2007

(65) Prior Publication Data
US 2010/0174963 A1    Jul. 8, 2010

(30) Foreign Application Priority Data

Mar. 29, 2006 (EP) .................................... 06006521

(51) Int. Cl.
*H03M 13/00* (2006.01)
(52) U.S. Cl. ........................ 714/755; 714/752; 714/794
(58) Field of Classification Search .......... 714/752–528, 714/794
See application file for complete search history.

(56) References Cited

U.S. PATENT DOCUMENTS
6,769,091 B2 * 7/2004 Classon et al. ................ 714/792
(Continued)

FOREIGN PATENT DOCUMENTS
EP    1659726 A2 *    5/2006
(Continued)

OTHER PUBLICATIONS

"Joint Graph-Decoder Design of IRA Codes on Scalable Architectures", Kienle et al., 2004 IEEE International Conference on Acoustics, Speech, and Signal, vol. 4, May 17-21, 2004, pp. IV-673-IV-676, XP0-7803-8484-9.

(Continued)

*Primary Examiner* — Jeffrey A Gaffin
*Assistant Examiner* — Steve Nguyen
(74) *Attorney, Agent, or Firm* — Allen, Dyer, Doppelt, Milbrath & Gilchrist, P.A.

(57) ABSTRACT

The method includes defining from all the check nodes at least one group of check nodes mutually connected through at least one second variable node defining an internal second variable node. The method includes performing for each group the joint updating of all the check nodes of the group via a Maximum-A-Posteriori (MAP) type process, and the updating of all the first variable nodes and all the second variable nodes connected to the group except the at least one internal second variable node. The method may include iteratively repeating the updates.

18 Claims, 7 Drawing Sheets

U.S. PATENT DOCUMENTS

| | | | | |
|---|---|---|---|---|
| 6,963,622 | B2 * | 11/2005 | Eroz et al. | 375/298 |
| 7,127,659 | B2 * | 10/2006 | Richardson et al. | 714/758 |
| 7,185,270 | B2 * | 2/2007 | Shen et al. | 714/801 |
| 7,302,629 | B2 * | 11/2007 | Kyung et al. | 714/752 |
| 7,350,130 | B2 * | 3/2008 | Tran et al. | 714/758 |
| 7,421,032 | B2 * | 9/2008 | Jin et al. | 375/262 |
| 7,458,009 | B2 * | 11/2008 | Yu et al. | 714/800 |
| 7,673,213 | B2 * | 3/2010 | Chugg et al. | 714/755 |

FOREIGN PATENT DOCUMENTS

| | | | |
|---|---|---|---|
| GB | 2431833 A | * | 5/2007 |

OTHER PUBLICATIONS

"High-Performance Decoders for Regular and Irregular Repeat-Accumulate Codes", Mansour, IEEE Globecom '04 Dallas, Nov. 29, 2004-Dec. 3, 2004, pp. 2583-2588, XP010757993, ISBN: 0-7803-8794-5.

"High-Throughput LDPC Decoders", Mansour et al., IEEE Transactions on Very Large Scale Integration (VLSI) Systems, IEEE Service Center, Piscataway, NJ, vol. 11, No. 6, Dec. 2003, pp. 976-996, XP011104612, ISSN: 1063-8210.

* cited by examiner

METHOD AND DEVICE FOR DECODING LDPC ENCODED CODEWORDS WITH A FAST CONVERGENCE SPEED

FIELD OF THE INVENTION

The present invention is generally directed to the field of data communication, and more specifically to the decoding of codewords encoded with a LDPC (Low-Density Parity-Check) code. The invention is more particularly, but not exclusively, directed to a data communication system utilizing IRA (Irregular Repeat Accumulate) codes. The invention may be also directed to LDPC codes deployed in the DVB-S2 (Digital Video Broadcast) standard, or in the WLAN 802.11n standard or in the WIMAX 802.16e standard, for example.

BACKGROUND OF THE INVENTION

IRA codes are, for example, described in the paper of Hui Jin et al entitled "Irregular Repeat-Accumulate Codes" presented at the second international conference on Turbo Codes, Brest, France, September 2000. Low-Density Parity-Check (LDPC) codes were introduced by Gallager in 1962 and rediscovered in 1996 by MacKay and Neal. For a long time they had no practical impact due to their computational and implementation complexity. This changed with advances in microelectronics that led to more computational power at hand for simulation and which now enables implementation. Due to their excellent error correction performance they are considered for future telecommunication standards.

An LDPC code is a linear block code defined by its sparse M×N parity check matrix H. It contains j ones per column and k ones per row, called row and column degree respectively. A (j,k)-regular LDPC code has row and column degree of uniform weight, otherwise the code is called irregular. A parity check code can be represented by a bipartite graph. The M check nodes correspond to the parity constraints, the N variable nodes represent the data symbols of the codeword. An edge in the graph corresponds to a one in the parity check matrix.

In the LDPC code encoder the packet to encode of size (N−M) is multiplied with a generator matrix G of size (N−M)×N. This multiplication leads to an encoded vector of length N. The generator matrix G and the parity check matrix H satisfy the relation GHt=0 where 0 is the null matrix.

Generally, an LDPC code decoder comprises a decoding module which receives the encoded vector of length N and delivers an intermediate vector of length N by using the parity check matrix H. Then a demapping module extracts the decoded vector of length (N−M) from the intermediate vector. More precisely, LDPC codes can be decoded using message passing algorithms, either in hard or soft decision form. The decoding is then an iterative process, which exchanges messages between variable and check nodes. Typically a Belief Propagation (BP) process is used, which exchanges soft-information iteratively between variable and check nodes. The code performance mainly depends on the randomness of the parity check matrix H, the codeword size N and the code rate R=(N−M)/N.

The channel coding part may be an important component in wireless communication systems like UMTS, WLAN and WPAN. Especially in the domain of WLAN and WPAN the latency of the decoding may be critical. Low Density Parity Check codes can be seen as a promising candidate for these systems in the near future. These codes are being deployed in the DVB-S2 standard and in some optical fiber communication systems. The codes have some interesting properties, which make them a natural choice for a latency critical application.

The new DVB-S2 standard features a powerful forward error correction (FEC) system, which allows for transmission close to the theoretical limit, i.e. provided by using LDPC codes, which can even outperform Turbo-Codes. To provide flexibility, 11 different code rates (R) ranging from R=¼ up to R=9/10 are specified with a codeword length up to 64800 bits. This maximum codeword length is the reason for outstanding communication performance, so the codeword length of 64800 bits is described.

For the DVB-S2 code, 64800 so called variable nodes (VN) and 64800×(1−R) check nodes (CN) exist. The connectivity of these two types of nodes is specified in the standard. The variable nodes comprise information nodes and parity nodes. For decoding the LDPC code, messages are exchanged iteratively between these two types of nodes, while the node processing is of low complexity. Generally, within one iteration, first the variable nodes (VN) are processed (updated), then the check nodes (CN) are processed (updated) one after another. The problem of this conventional two phase-process or message passing, referred to as "two-phase MP", is the slow convergence speed, i.e. the limited communications performance for a fixed number of iterations.

The Mansour et al. article entitled "High-Throughput LDPC Decoders", IEEE Transactions on a Very Large Scale Integration Systems (VLSI), vol. 11, No. 6, pp 976-996, December 2003 has shown that the convergence speed can be improved when the updated messages of a node are directly passed to the other nodes. More precisely, according to this article, a subset of check nodes are processed separately and the newly calculated messages are immediately passed to the corresponding variable nodes. The variable nodes update their outgoing messages. The next check nodes subset will thus receive newly updated messages which improve convergence speed. This scheduling is called "Turbo Decoding Message Passing" in this article and referred to as "turbo MP" thereafter.

The Hocevar article entitled "A reduced complexity decoder architecture via layered decoding of LDPC codes", in Proc. IEEE Workshop on Signal Processing Systems (SIPS '04), Austin, USA, October 2004, pp. 107-112, as well as the Colavolpe article entitled "Design and Performance of Turbo Gallager Codes", IEEE Transactions on Communications, vol. 52, no. 11, pp. 1901-1908, November 2004, have teachings analogous to those of the Mansour et al. article.

SUMMARY OF THE INVENTION

An object of the invention is to provide a decoding method for LDPC codes which has a faster convergence speed than the conventional decoding methods described above.

The decoding method according to an embodiment interprets in particular the transmitted codeword as a punctured codeword which is efficiently exploited by calculating the joint Maximum-A-Posteriori (MAP) probability of several check nodes, each check node being considered as an elementary 2-state trellis. In other words, according to an aspect of the present approach, groups of check nodes mutually connected through parity nodes referred to as "internal parity nodes", or eventually all the check nodes forming a single group, are jointly updated and all the internal parity nodes are not updated. This differs from the conventional decoding methods which update each check node separately and which update all the parity nodes without exception. It is noted here that, as used herein, updating a node means that all the messages to be emitted from this node to another node are updated.

According to an aspect of the invention, a method for decoding a LDPC encoded codeword is provided, the LDPC code being represented by a bipartite graph comprising check nodes and variable nodes including first variable nodes, for example information nodes, and second variable nodes of degree two, for example parity nodes, connected to the check nodes by a zigzag connectivity.

According to a general feature of this aspect of the invention, the method includes a) defining from the check nodes at least one group of check nodes mutually connected through at least one second variable node defining an internal second variable node, and performing for each group the following: b1) jointly updating all the check nodes of the group by using a Maximum-A-Posteriori (MAP) type process; b2) updating all the first variable nodes and all the second variable nodes connected to the group except the at least one internal second variable node; and c) iteratively repeating the above.

According to an embodiment, when all the check nodes form a single group, step b) may include: b1) jointly updating all the check nodes by using the Maximum-A-Posteriori (MAP) type process; and b2) updating all the first variable nodes except the second variable nodes. In other words, according to this embodiment all the second variable nodes define the so-called "internal second variable nodes". However, although this embodiment of the invention increases the convergence speed, in particular because of the joint updating of the check nodes by using the MAP process, two phases are still used, one phase for the entire trellis calculation (the updating of the check nodes) and one phase to update the information nodes.

It may be efficient to decode a small section of the entire trellis, update the information via the information nodes, and then calculate the next section of the trellis. In other words, according to another embodiment of the invention, a) may include dividing the check nodes in at least two groups of at least two check nodes mutually connected through at least one internal second variable node, each group being connected to a neighboring group by one second variable node called connecting second variable node. Further, b2) may comprise updating all the first variable nodes connected to the check nodes of the group and updating each connecting second variable node connected to the group without updating the internal second variable nodes.

According to an embodiment, the check nodes are divided such that for each group, all the check nodes of the group are respectively connected to different first variable nodes, this may improves even more the conversion speed of the method. The MAP type process may be a so-called LogMAP algorithm or a so-called MaxLogMAP algorithm.

According to an embodiment of the invention, the LDPC code may be an irregular repeat-accumulate (IRA) code. The LDPC code may be, for example, a DVB-S2 LDPC code. The LDPC code may also be a code deployed in the WLAN 802.11n standard or in the WIMAX 802.16e standard. Each encoded codeword may be received from a wireless medium of a wireless communication system.

According to another aspect of the invention, a decoder for decoding an LDPC encoded codeword is provided, the LDPC code being represented by a bipartite graph comprising check nodes and variable nodes including first variable nodes and second variable nodes of degree two connected to the check nodes by a zigzag connectivity. The decoder includes a processor including a check node processor adapted to update check nodes and a variable node processor adapted to update variable nodes, and a controller adapted to activate the processor.

According to a general feature of this aspect of the invention, all the check nodes define at least one group of check nodes mutually connected through at least one second variable node defining an internal second variable node. The check nodes processor may implement an a Maximum-A-Posteriori (MAP) type process and is adapted to jointly update all the check nodes of a group. The controller may be adapted to iteratively activate the processor, and during each iteration, to activate for each group the check nodes processor and the variable nodes processor for jointly updating all the check nodes of the group and updating all the first variable nodes and all the second variable nodes connected to the group except the at least one internal second variable node.

According to an embodiment of the invention, all the check nodes may form a single group. The check nodes processor may be adapted to jointly update all the check nodes, and during each iteration the controller may be adapted to activate the check nodes processor and the variable nodes processor for jointly updating the check nodes processor and updating all the first variable nodes except all the second variable nodes.

According to another embodiment of the invention, the check nodes may be divided in at least two groups of at least two check nodes mutually connected through at least one internal second variable node, each group being connected to a neighboring group by one second variable node referred to as a connecting second variable node. The controller may be adapted to iteratively activate the processor and during each iteration, to activate for each group the check nodes processor and the variable processor for jointly updating all the check nodes of the group, updating all the first variable nodes connected to the check nodes of the group and updating each connecting second variable node connected to the group, without updating the internal second variable nodes.

According to another aspect of the invention, a terminal of a wireless communication system is provided and includes a decoder as defined above.

BRIEF DESCRIPTION OF THE DRAWINGS

Other advantages and features of the invention will appear on examining the detailed description of non-limiting embodiments, and of the appended drawings in which.

DETAILED DESCRIPTION OF THE PREFERRED EMBODIMENTS

In the following description, unless otherwise mentioned, the LDPC code is a DVB-S2 LDPC code as defined in "ETSI EN 302 307 v1.1.1 (2004-06)" defining the DVB-S2 standard, although the invention is not limited to such a code and be used for any other LDPC code, as for example those deployed in the WLAN 802.11n standard or in the WIMAX 802.16e standard, for example. The parity check matrix H of LDPC code is a sparse binary matrix. The set of valid codewords x should satisfy $H^t x = 0$.

A column in H is associated to a bit of the codeword and a row corresponds to a parity check. A non-zero element in a row of H means that the corresponding bit contributes to this parity check. The code can best be described by a bipartite graph called a Tanner graph, which is a graphical representation of the associations between code bits and parity checks. Code bits are shown as variable nodes $VN_i$ (circles), and parity checks as check nodes $CN_i$ (squares), with edges connecting them. The number of edges on each node is called the node degree. If the node degree is identical, for all variable nodes, the parity check matrix H is called regular, otherwise the parity check matrix is called irregular.

Figure 1:
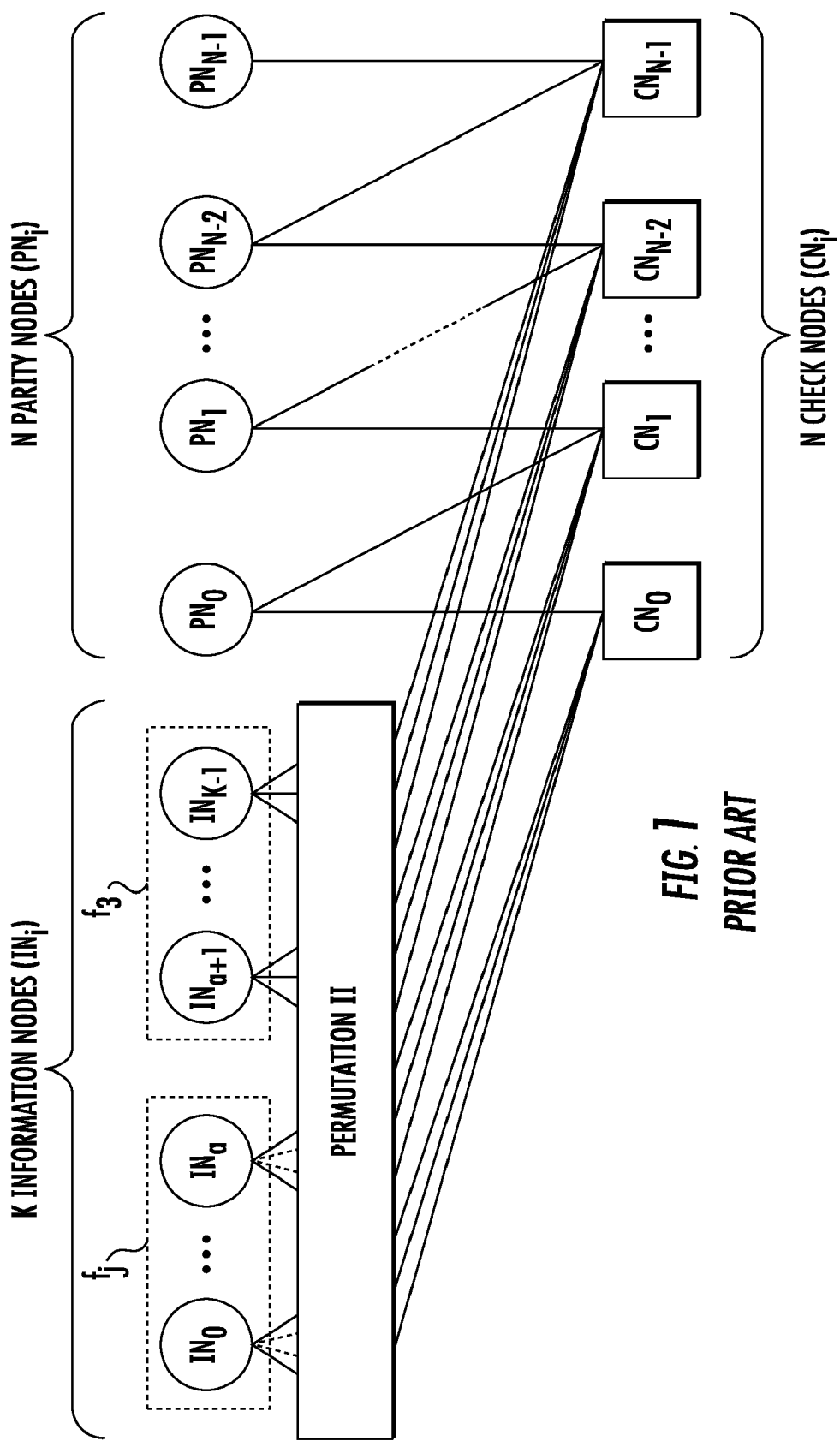
FIG. 1 is a diagram illustrating a bipartite graph of a DVB-S2 LDPC code.

The DVB-S2 parity check matrix includes two distinctive parts, a random part dedicated to the systematic information, and a fixed part that belongs to the parity information. The Tanner graph of a DVB-S2 code is illustrated in FIG. 1. Two types of variable nodes exist, i.e. a first subset of variable nodes called the information nodes $IN_i$, and a second subset of variable nodes called the parity nodes $PN_i$, respectively corresponding to the systematic and parity bits of the codeword.

The permutation Π represents the random matrix part of the connectivity between information nodes IN and check nodes $CN_i$. The parity nodes $PN_i$ are all of degree two and are connected in a fixed zigzag pattern to the check nodes $CN_i$. The N check nodes have a constant number of incident edges coming from the information nodes and it is referred to here as check node grouping a. Further, the degree of a check node corresponds to the number of incident edges coming from the information nodes and from the parity nodes. Here the first check node $CN_0$ is of degree 4 whereas all the other check nodes are of degree 5.

The K information nodes comprise two subsets $f_j$ and $f_3$, respectively designating the number of information nodes of degree j and of degree 3. The connectivity of the information nodes and the check nodes is defined by the DVB-S2 encoding rule:

$$\begin{cases} p_j = p_j \oplus i_m \\ j = (x + q(m \bmod 360)) \bmod N \end{cases} \quad (1)$$

wherein:
$p_j$ is the $j^{th}$ parity bit;
$i_m$ is the is the $m^{th}$ information code bit; and
x, q, and n are code rate dependant parameters specified by the DVB-S2 standard.

This encoding rule determines the entries of the parity check matrix. The $m^{th}$ column has nonzero elements in each row j, thus the permutation Π generates one edge between every check node $CN_m$ and information node $IN_j$. The fixed zigzag pattern connectivity between the parity nodes $PN_i$ and the check nodes $CN_i$ is defined by the encoding scheme:

$$p_j = p_j \oplus p_{j-1}, j = 1, 2, \ldots, N-1 \quad (2)$$

This is a straightforward accumulator. The corresponding part of the parity check matrix has two non-zero elements in each column, forming a square banded matrix.

Conventionally, LDPC codes can be decoded using a message passing process ("two-phase MP"). It exchanges soft-information iteratively between the variable nodes and check nodes. The exchanged messages are generally log-likelihood ratios (LLR). A LLR value comprises a sign allowing a decision whether the transmitted bit is "0" or "1", and a magnitude representing the confidence in this decision. Each variable node of degree i calculates an update of message k according to the relation:

$$\lambda_k = \lambda_{ch} + \sum_{l=0, l \neq k}^{i-1} \lambda_l \quad (3)$$

in which $\lambda_k$ is the LLR updated from the variable node, $\lambda_{ch}$ is the corresponding channel LLR of the variable node, and $\lambda_l$ are the LLRs of the incident edges of the variable node. The check node message updates are generally calculated according to the relation, for a message k:

$$\tanh(\lambda_k / 2) = \prod_{l=0, l \neq k}^{i-1} \tanh(\lambda_l / 2) \quad (4)$$

with $\lambda_k$ the LLR updated from the check node, and $\lambda_l$ the LLRs of the incident edges of the check node.

The DVB-S2 standard supports LDPC codes ranging from code rate R equal to ¼ to code rate R equal to 9/10. For each DVB-S2 code, the check nodes $CN_i$ and the parity nodes $PN_i$ are connected in a zigzag pattern. In other words, two successive check nodes are connected by a parity node of degree two.

A variable node of degree two has the property that the input of the first incident edge simply added with the corresponding channel value is the output of the second incident edge, and vice versa. Thus, conventionally, the updates of the nodes can be done in a canonical scheduling. In the first step, all variables nodes have to be updated, and in the second step, all check nodes are updated. This two phase-message passing process ("two-phase MP") is the most common applied decoding algorithm for LDPC codes. However, the major disadvantage of this two phase-update is its slow convergence speed.

The present approach provides a decoding method having a faster convergence speed. One possibility to realize an LDPC encoder is as follows. The encoder includes a repetition unit which repeats the information bits corresponding to its degree distribution. This expanded sequence is interleaved (Π), followed by a parity grouping, denoted as Σa. This grouping calculates the parity check sum of a bits (modulo 2). The result is accumulated by a 2-state RSC encoder afterwards. The resulting parity sequence $\vec{p}$ and the systematic information $\vec{u}$ are transmitted. The resulting Tanner-graph of this encoder results in the fixed zigzag connectivity of the parity nodes.

Figure 2:
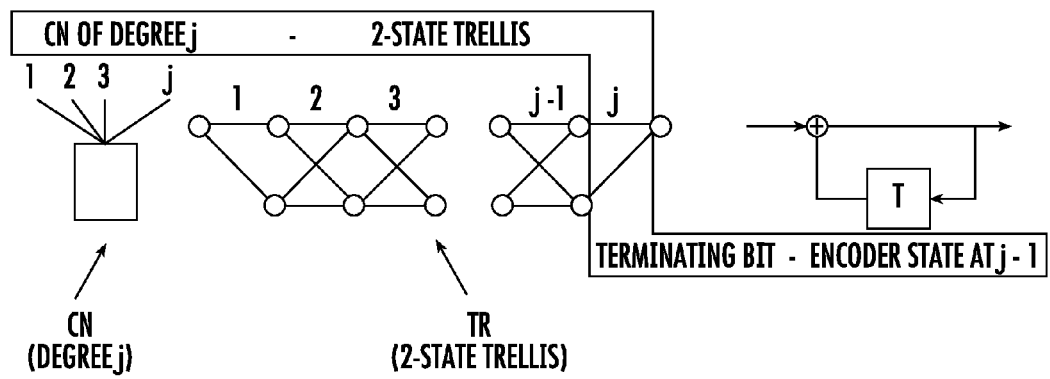
FIG. 2 is a diagram illustrating the correspondence between a check node of degree j and a two state-trellis.

On another hand, a check node can be seen as a terminated 2-state trellis. This is shown in FIG. 2 for a check node CN of degree j. The terminating bit of the trellis corresponds to the trellis state at time step j−1 which corresponds as well to a grouping $\Sigma_{j-1}$. And the inventors have observed that the conventional linear encoding scheme with parity check grouping $\Sigma_a$ and 2-state RSC encoder may be comparable to an encoding scheme with 2-state RSC encoder and puncturing unit.

In other words, the present decoding method will interpret a transmitted codeword as a punctured codeword. This will lead to jointly updating the check nodes (either all the check nodes together or by groups of check nodes) without updating the parity nodes (called "internal" parity nodes) connected to the check nodes of a same group. No modification of a conventional LDPC encoder is necessary to carry out the decoding method of the invention.

Figure 3:
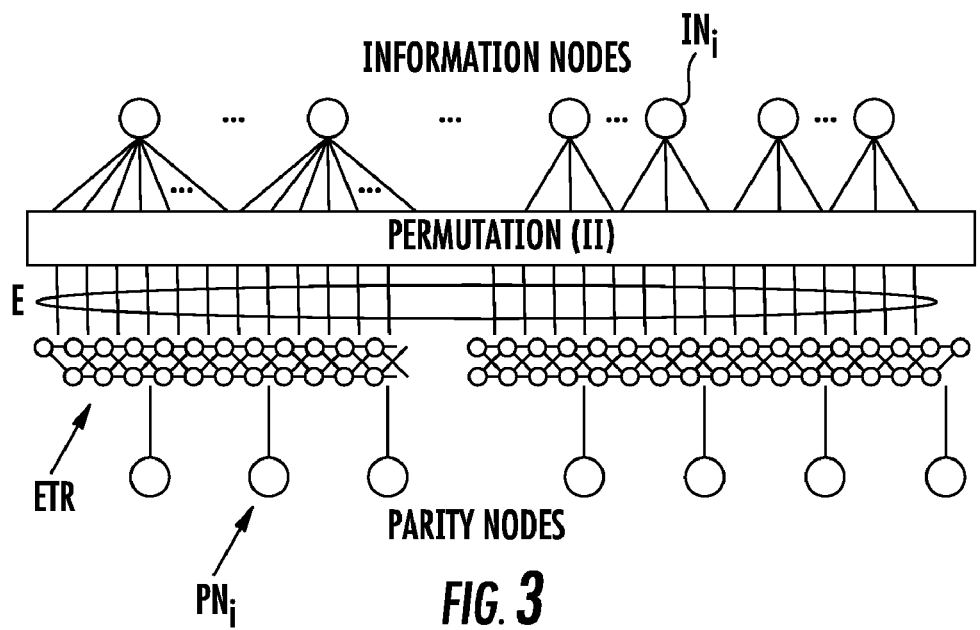
FIG. 3 is a graph illustrating a representation of an LDPC code presented with a trellis representation.

A first embodiment of the invention is illustrated in FIG. 3. In this figure, all the check nodes form a single group and are represented by the entire trellis ETR. Accordingly, all the parity nodes $PN_i$ are considered as being internal parity nodes. A flow chart of the method according to this first embodiment is diagrammatically illustrated in FIG. 4.

More precisely, in step 40, all the information nodes are firstly initialized with the corresponding channel LLR values $\lambda_{ch}$, in fact with the systematic information contained in these channel values. The initialized messages are then passed permuted to the 2-state trellis ETR. In step 41, the messages are calculated via the entire 2-state trellis ETR by applying the BCJR algorithm which is well known by those skilled in the art. For more details, reference is made to L. Bahl, J. Cocke, F. Jelinek, and J. Raviv, "Optimal Decoding of Linear Codes for Minimizing Symbol Error Rate", IEEE Transaction on Information Theory, vol. IT-20, pp. 284-287, March 1974.

And, all the check nodes are jointly updated, i.e. all the messages from the check nodes to the information nodes will be jointly updated, without updating the parity nodes $PN_i$. However, although the parity nodes are not updated, the parity information $\vec{\lambda}_{PN}$ contained in the received LLR values $\vec{\lambda}_{ch}$ (input messages) will be taken into account. More precisely, the BCJR algorithm computes the maximum a posteriori (MAP) probability for each bit to have been sent as $u_k=0$ or $u_k=1$. The original probability based formulation in the Bahl article involves many multiplications and has thus been ported to the logarithmic domain to become the Log-MAP Algorithm. The Log-MAP algorithm is also well known and reference can be made, for example, to P. Robertson, P. Hoeher, and E. Villebrun, "Optimal and Sub-Optimal Maximum a Posteriori Algorithms Suitable for Turbo Decoding", European Transactions on Telecommunications (ETT), vol. 8, no 2, pp. 119-125, March-April 1997.

The MAP probability of input k calculates to:

$$\Lambda_k = \log \frac{Pr\{u_k = 0 | \vec{\lambda}_{IN}, \vec{\lambda}_{PN}\}}{Pr\{u_k = 1 | \vec{\lambda}_{IN}, \vec{\lambda}_{PN}\}}. \quad (4)$$

The LLRs of the information nodes $\vec{\lambda}_{IN}$ represent the systematic input, while the parity nodes messages $\vec{\lambda}_{PN}$ represent the parity information. Equation 4 can be expressed using three probabilities, which refer to the encoder states $S_k^m$, where $k \in \{0 \ldots E\}$ and $m, m' \in \{1,2\}$ with E the number of IN messages [see FIG. 3].

The branch metrics $\gamma_{m,m'}^{k,k+1}(u_k)$ is the probability that a transition between $S_k^m$ and $S_{k+1}^{m'}$ has taken place. It is derived from the input messages $\vec{\lambda}_{IN}$ and $\vec{\lambda}_{PN}$, the code structure, and the assumption of $u_k=0$ or $u_k=1$. For details, reference is made to the above mentioned Robertson et al article.

Using these branch metrics the probability $\alpha_m^k$ can be obtained, which represents the probability that the encoder reached state $S_m^k$ given the initial state and the received sequence $\vec{\lambda}_{IN}$ and $\vec{\lambda}_{PN}$. It computes to:

$$\alpha_{m'}^k = \sum_m \alpha_m^{k-1} \cdot \gamma_{m,m'}^{k-1,k}.$$

This computation is called forward recursion. Performing a backward recursion yields the probability $\beta_m^{k+1}$ that the encoder has reached the (known) final state given the state $S_m^{k+1}$ and the remainder of the received sequence $y_{k+1}^N$:

$$\beta_m^k = \sum_{m'} \beta_{m'}^{k+1} \cdot \gamma_{m,m'}^{k,k+1}$$

$\alpha$s and $\beta$s are both called state metrics. Equation 4 can be rewritten as:

$$\Lambda_k = \log \frac{\sum_m \sum_{m'}' \alpha_m^k \cdot \beta_{m'}^{k+1} \cdot \gamma_{m,m'}^{k,k+1}(u_k = 0)}{\sum_m \sum_{m'}' \alpha_m^k \cdot \beta_{m'}^{k+1} \cdot \gamma_{m,m'}^{k,k+1}(u_k = 1)}. \quad (5)$$

When all a posteriori values $\vec{\Lambda}$ are calculated the extrinsic information $\vec{\Lambda}^{ext}$ which is determined by subtracting the appropriate input messages $\vec{\lambda}_{IN}$ to avoid a confirmation of the old information are passed back to the information nodes. Thus $\vec{\Lambda}^{ext}$ is calculated to:

$$\vec{\Lambda}^{ext} = \vec{\Lambda} - \vec{\lambda}_{IN} \quad (6)$$

In other words, $\vec{\Lambda}^{ext}$ represents the vector of all the messages jointly updated by the check nodes and to be passed back to the information nodes.

In step 42, all information nodes are active and updated according to equation (3) above. In other words, all the messages from the information nodes to the check nodes are updated according to the conventional equation (3) above, in which $\lambda_{ch}$ is here the systematic information of the LLR channel value. After all the information nodes have been updated in step 42, the iteration is ended and a new iteration can start (step 43). The iterative decoding process is continued until a conventional stopping criteria is reached. For example, the stopping criteria may be a predetermined number of iterations required to gain the designed communication performance. For example, for decodable blocks or codewords, the stopping criteria taking into account a check node sum of the Log-likelihood ratio of the incident ages is a very good stopping criteria.

Figure 5:
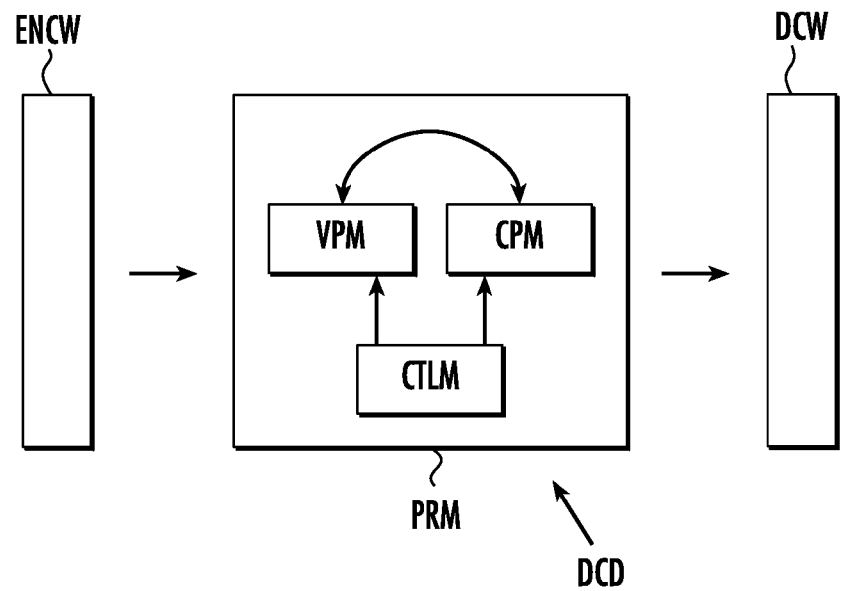
FIG. 5 is a schematic diagram illustrating an embodiment of a decoder according to the invention.

An example of decoder DCD of the present invention is diagrammatically illustrated in FIG. 5. More precisely, the decoder DCD comprises a processor or processing means PRM including a variable nodes processor or processing means VPM, a check nodes processor or processing means CPM as well as controller or control means CTLM for controlling the variable nodes processor VPM and the check nodes processor CPM. Thus, each LDPC encoded codeword ENCW is received by the decoder DCD and the decoder delivers a corresponding decoded codeword DCW.

The variable nodes processor VPM may be realized by software to update the information nodes according to equation (3) above. Otherwise, the variable nodes processor may be realized by hardware, for example by using accumulators. The check nodes processor may be realized by a conventional MAP unit, either by hardware or by software within a microprocessor. The controller may be also realized by hardware or by software within a microprocessor. In an embodiment, the controller may be adapted to iteratively activate the processor PRM, and during each iteration to activate the check nodes processor CPM and the variable nodes processor PM for jointly updating the check nodes and updating all the information nodes except all the parity nodes.

Figure 4:
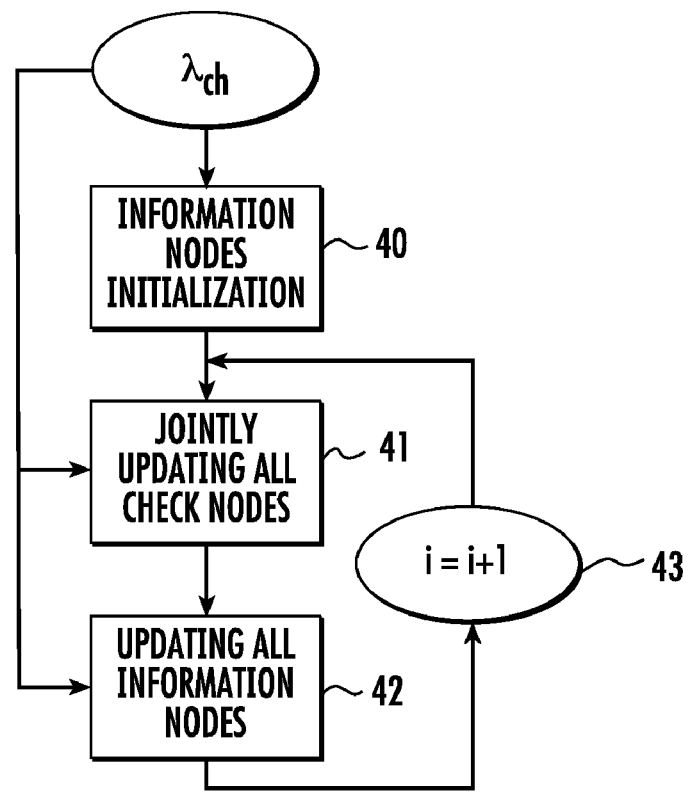
FIG. 4 is a diagram illustrating a flow chart related to a first embodiment of a method according to the invention.

According to the embodiment illustrated in FIG. 4, the Log-MAP algorithm used across the entire trellis ETR still uses two phases, one phase for the trellis calculation (the jointly updating of the check nodes), and one phase to activate and update the information nodes. However, it is may be more efficient to decode a small section of the trellis, update the information via the information nodes and then calculate the next section of the trellis. Such an embodiment is more particularly illustrated in FIGS. 6 and 7.

The entire trellis is partitioned in smaller sections $TRS_i$ corresponding to groups $GR_i$ of check nodes. The number of information node edges involved in one trellis section is referred to as section size S. In the present example, S=6. In other words, each trellis section $TRS_i$ corresponds to a group $GR_i$ of two check nodes having a grouping equal to 3.

Figure 6:
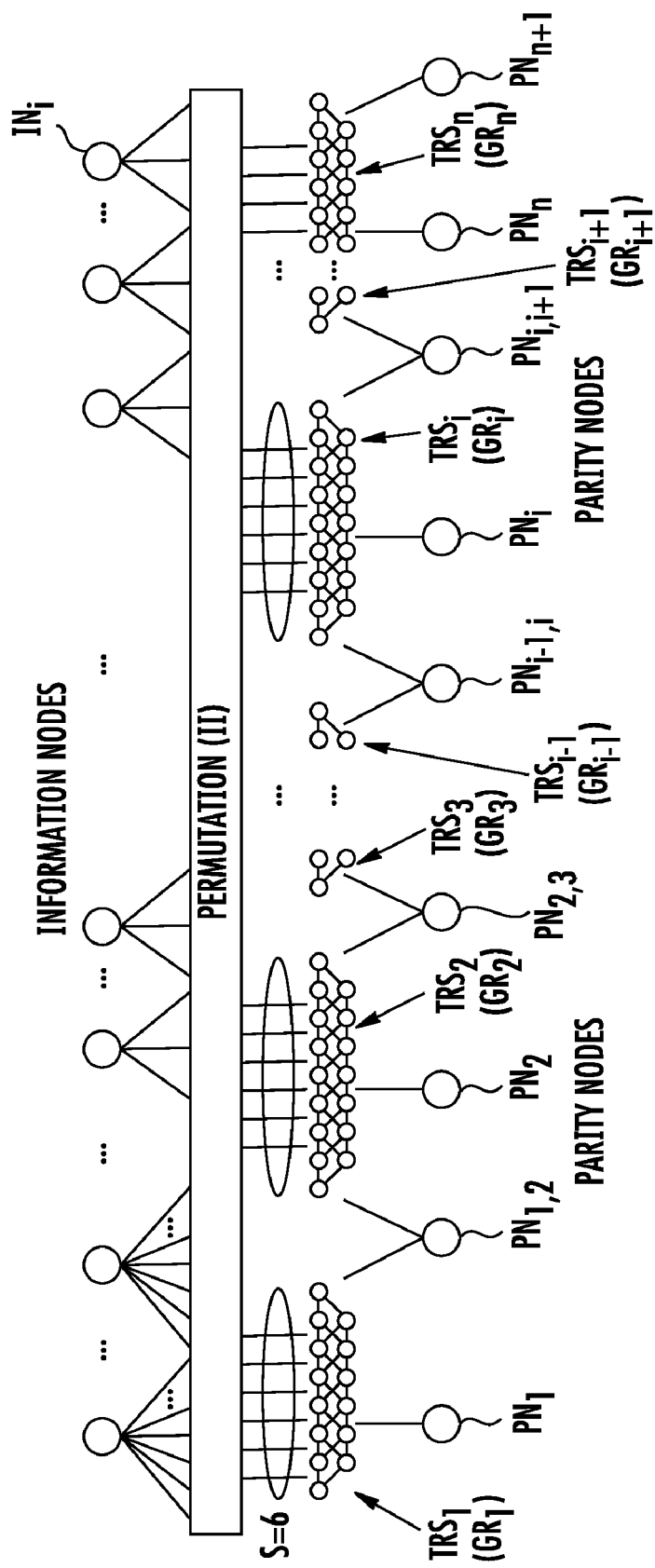
FIG. 6 is a diagram illustrating a representation of an LDPC code presented with trellis sections with a section size of S=6.

In the original Tanner graph illustrated in FIG. 1, two adjacent check nodes are connected through one parity node. This parity node is referred to here as an "internal" parity node. This is the case for example for parity node $PN_1$ of the first group $GR_1$ or first trellis section $TRS_1$ in FIG. 6. More generally, as illustrated in the example of FIG. 6, each group $GR_i$ (trellis section $TS_i$) is associated to one internal parity node $TN_i$, except for the last trellis section $TRS_n$, which is associated to two internal parity nodes $PN_n$ and $PN_{n+1}$.

As will be explained in more detail below, all these internal parity nodes will not be updated during the iterative decoding method according to the invention. Further, each trellis section $TRS_i$ or group $GR_i$ is connected to a neighboring group by one parity node referred to here as a "connecting" parity node. In the present example, group $GR_1$ is connected to group $GR_2$ by the connecting parity node $PN_{1,2}$ and more generally, group $GR_i$ is connected to group $GR_{i-1}$ through connecting parity node $PN_{i-1,i}$ and to group $GR_{i+1}$ through connecting parity node $PN_{i,i+1}$.

Figure 7:
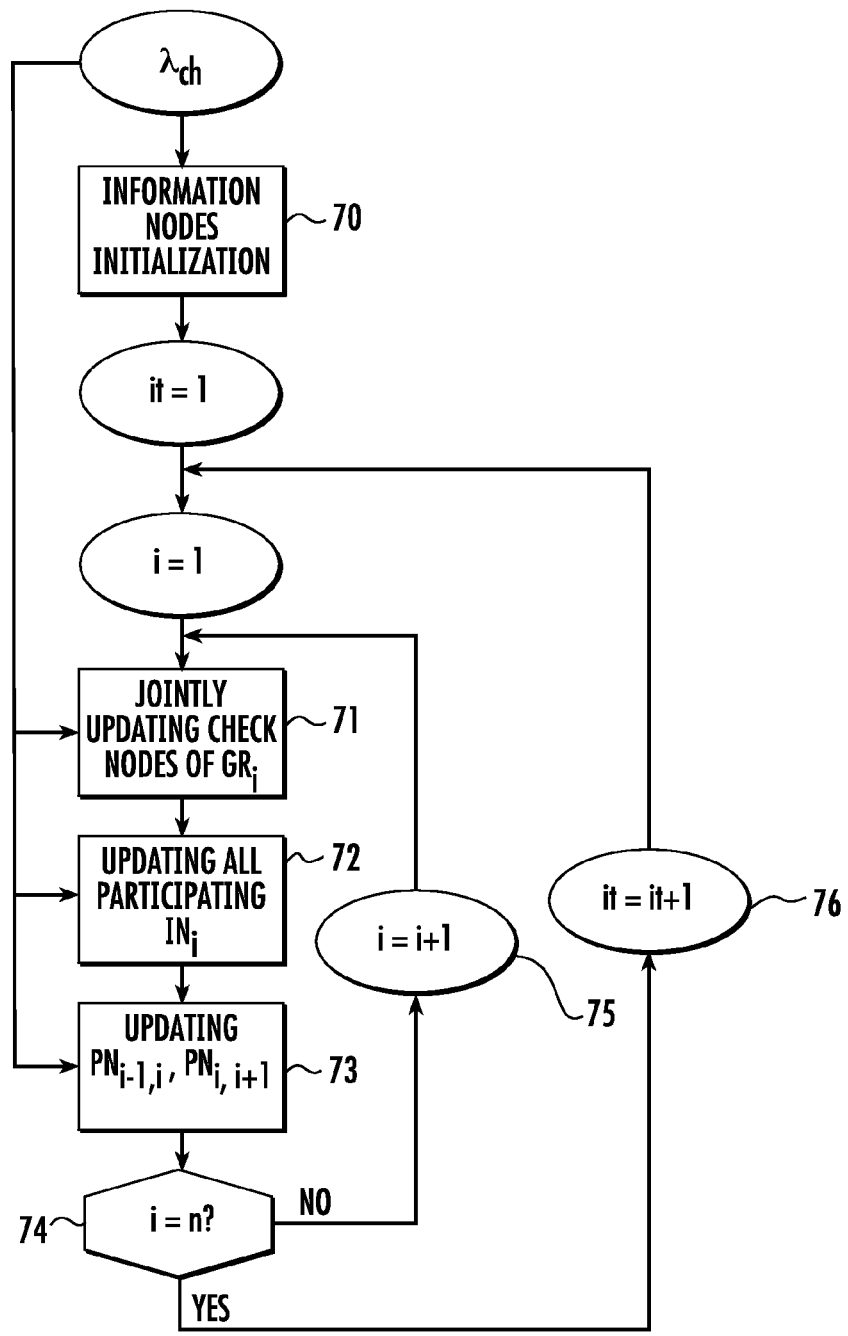
FIG. 7 is a diagram illustrating a flow chart related to another embodiment of a method according to the invention.

In the present example, the check nodes have been divided in groups of two check nodes. However, the number of check nodes within a group or a trellis section may be different and also may be different from one group to another. However, the decoding method is even more efficient when all the check nodes of each group are respectively connected to different information nodes. A flow chart of a decoding method according to this embodiment is illustrated in FIG. 7.

Briefly speaking, starting from the information nodes, the corresponding messages are passed to the first trellis section. Using the Log-MAP algorithm, the new extrinsic information are calculated and passed back to the participating information nodes, i.e. the information nodes which are connected to the first trellis section. The output messages of the participating information nodes are updated according to equation (3) above. Then, the next trellis section is processed. One iteration is finished when all trellis sections have updated their messages. The message passing between the boundaries of two trellis sections is done via a connecting parity node which is a standard variable node of degree two and which is updated according to the equation (3) above. More precisely, if we refer now to FIG. 7, the first step 70 is the information nodes initialization using the LLR channel values $\lambda_{ch}$ (the systematic information). This initialization step 70 is analogous to initialization step 40 of FIG. 4. Then, iteration 1 (it=1) begins.

Iteration 1 begins with the processing of the first trellis section $TRS_i$ or the first group $GR_i$ of the check nodes (i=1). All the check nodes of group $GR_1$ are jointly updated by using the Log-MAP algorithm as explained above. In other words, only one section within the entire trellis is processed and such sectional processing of a trellis is known per se by those skilled in the art and is called "windowing". The state metrics at the boundaries may be calculated conventionally by an acquisition phase with a forward or backward recursion respectively. However, the acquisition phase can be avoided here, because the parity bit of a two-states RST encoder will terminate the trellis in the next time step. Thus, this termination condition can be used to start the forward or backward recursion whenever a parity node information is available.

After all the check nodes of group $GR_1$ have been updated (step 71), all participating information nodes IN are updated according to the conventional equation (3) above (step 72). The so-called participating information nodes $IN_j$ are the information nodes which are connected to the first trellis section TRS1 which represents the first group $GR_1$ of the check nodes. Then, the parity nodes connected to this first trellis section $TRS_1$ are updated, except of course the internal parity node $PN_1$.

In the present example, the parity node which is connected to the first trellis section $TRS_1$ is the connecting parity node $PN_{1,2}$. This connecting parity node is updated conventionally according to equation (3) above in which $\lambda_{ch}$ is the parity information (step 73). Then, the second trellis section $TRS_2$ is processed.

More precisely, all the check nodes corresponding to this trellis section $TRS_2$ are jointly updated (step 71). Then, all participating information nodes are updated (step 72) and then the connecting parity nodes $PN_{1,2}$ and $PN_{2,3}$ are updated. The decoding continues until the last trellis section $TRS_n$ is reached. Again, the check nodes corresponding to this last trellis section $TRS_n$ are jointly updated (step 71), then all participating information nodes are updated (step 72) and, finally, the connecting parity node $PN_{n-1,n}$ is again updated (step 73). And, for this last trellis section, the internal parity nodes $PN_n$ and $PN_{n+1}$ are not updated. At this stage, iteration 1 is finished and the next iteration (it=it+1; step 76) can start. The decoding process will be stopped when a stopping criteria will be reached as already explained above with reference to FIG. 4.

In the present example, during each iteration, the trellis sections have been successively processed from the first trellis section to the last trellis section. However, it is possible, according to the invention, to successively process the trellis sections in any order during each iteration. The section size S is chosen to be a multiple of the grouping or degree of check nodes to ensure a joint MAP processing of at least two check nodes. A suitable value for S could be S=10a ("a" being the grouping or degree of the check nodes).

On a hardware point of view, a decoder for another embodiment of the invention may be analogous to the one which is illustrated in FIG. 5. But of course, the controller is realized or programmed to perform the different steps illustrated in FIG. 7. Further, the variable processor VPM is used to either update the information nodes or the connecting parity nodes.

The conversion speed of the decoding method according to the invention is faster than the conventional "two-phase MP" according to the prior art and than the so-called "turbo MP"

disclosed in the Mansour article, both prior art methods using separate updating of the check nodes with an updating of all the parity nodes without exception. The decoding method according to the invention supports a high code rate flexibility. Further, the decoding method according to the invention considerably reduces the number of required iterations and furthermore results in a lower error floor.

Figure 8:
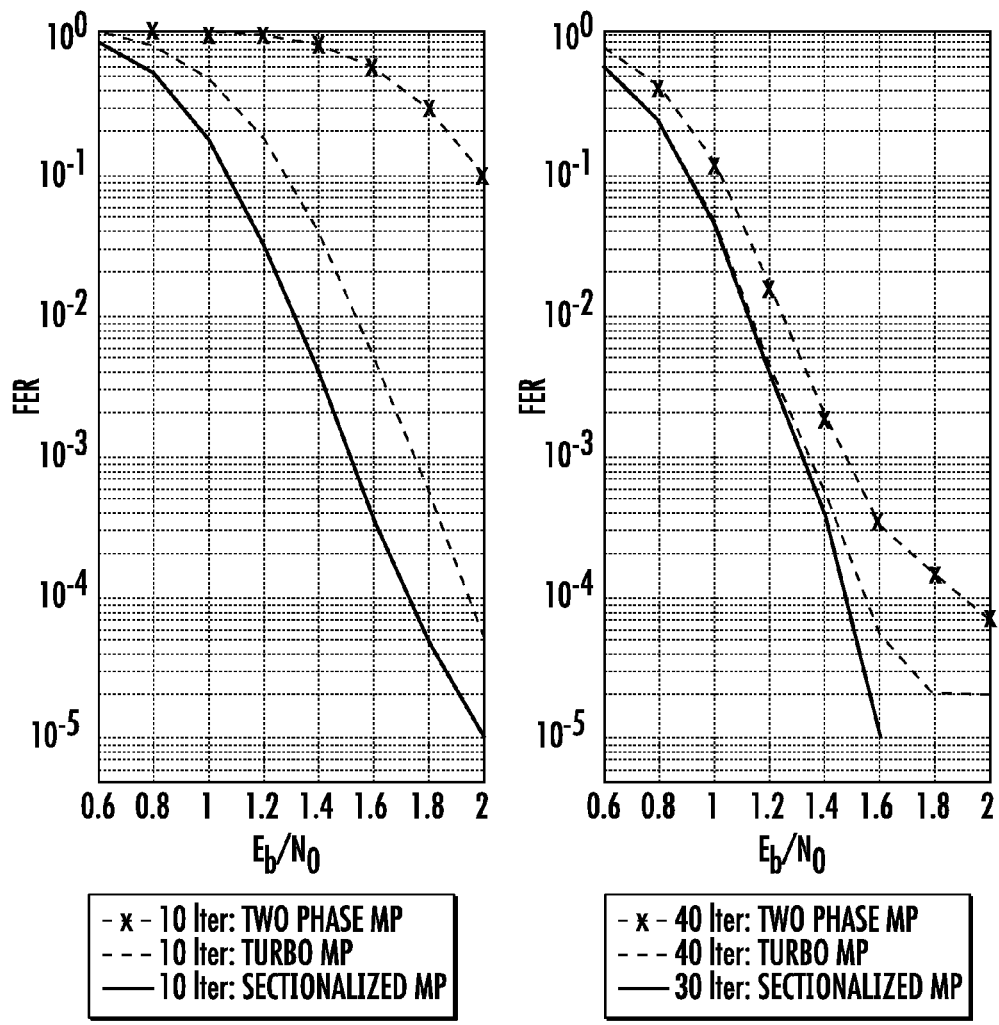
FIG. 8 is a diagram illustrating curves related to Frame Error Rate (FER)

As an example, FIG. 8 shows the communications performance of irregular LDPC codes using a different messages passing algorithm, i.e. the conventional two-phase message passing ("two-phase MP"), the so-called turbo message passing algorithm ("turbo MP") and a decoding method according to the second embodiment of the invention, referred to here as "sectionalized MP".

The Frame Error Rate (FFR) curves of the left part of FIG. 8 assume 10 iterations, and the curves of the right part of FIGS. 8, 40, 40 and 30 iterations for two-phase MP, turbo MP and sectionalized MP respectively. $E_b$ is the mean energy for transmitting a bit information on the channel and $N_a$ is the noise energy of the channel. 100 k blocks are simulated over an AWGN channel. The LDPC code is an irregular LDPC code with 1600 bits and an IN degree distribution of ($\lambda 3=0.52$, $\lambda 4=0.24$, $\lambda 5=0.08$, $\lambda 9=0.04$, $\lambda 31=0.12$). Further the grouping a (check node degree) is equal to 7 and the resulting code rate is R=0.5.

The sectionalized MP uses a section size of S=70 which corresponds to a joint processing of 10 CNs for the code rate R=0.5. The convergence speed of the sectionalized MP is always faster than the turbo MP and the two-phase MP. In particular for low code rates the difference in the convergence speed is remarkable. For the case R=0.125 and 10 iterations the turbo MP and two-phase MP the FER did not even start to converge. Further, when using the two-phase MP, around 200 iterations are required to achieve the communications performance obtained after 30 iterations of the sectionalized MP.

Figure 9:
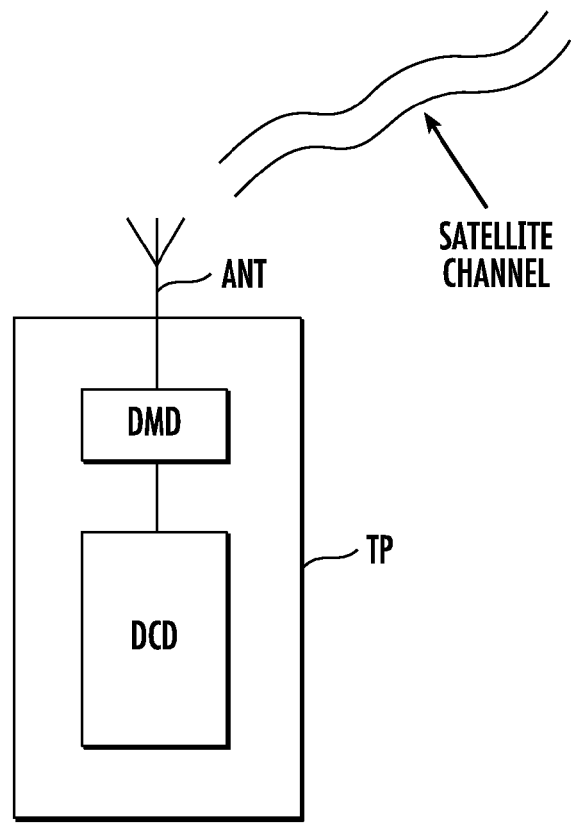
FIG. 9 is a schematic diagram illustrating a terminal of a wireless communication system according to the invention.

Another important advantage is that the error floor can be lowered due to the joint calculation of several $CN_s$. The sectionalized MP has a lower error floor than the turbo MP which has in turn a lower error floor than the two-phase MP. The LDPC decoder DCD may be incorporated in a receiver TP (FIG. 9) of a wireless communication system, for example a DVB-S2 receiver receiving encoded codewords through a satellite channel and comprising other conventional components as for example a demodulator DMD. The decoder may be also incorporated in a base station or any other access point.

However the invention is not limited to such an application. For example the LDPC encoded codewords may be received from a wireline communication system, for example an xDSL system or an optic fiber system. And the decoder may be incorporated in an element of such a wireline communication system.

The invention claimed is:

1. A method for decoding a Low-Density Parity-Check (LDPC) encoded codeword, the LDPC code being represented by a bipartite graph between check nodes and variable nodes including first variable nodes and second variable nodes of degree two connected to the check nodes via a zigzag connectivity, the method comprising:
    defining from the check nodes at least two groups of at least two check nodes mutually connected through at least one internal second variable node, each group being connected to a neighboring group by one second variable node defining a connecting second variable node;
    updating, for each group, by jointly updating the check nodes of the group with a Maximum-A-Posteriori (MAP) type process in a decoder, and updating all the first variable nodes connected to the check nodes of the group and updating each connecting second variable node connected to the group without updating the internal second variable nodes; and
    iteratively repeating the updating.

2. The method according to claim 1, wherein for each group, all the check nodes of the group are respectively connected to different first variable nodes.

3. The method according to claim 1, wherein the MAP type process comprises at least one of a LogMAP process and a MaxLogMAP process.

4. The method according to claim 1, wherein the first variable nodes define information nodes, and the second variable nodes define parity nodes.

5. The method according to claim 1, wherein the LDPC code comprises an Irregular Repeat-Accumulate (IRA) code.

6. The method according to claim 1, wherein the LDPC code comprises at least one of a DVB-S2 LDPC code, a WLAN 802.11n defined code and a WIMAX 802.16e defined code.

7. The method according to claim 1, wherein the LDPC encoded codeword is received from a wireless medium of a wireless communication system.

8. A decoder for decoding a Low-Density Parity-Check (LDPC) encoded codeword, the LDPC code being represented by a bipartite graph between check nodes and variable nodes including first variable nodes and second variable nodes of degree two connected to the check nodes via a zigzag connectivity, the decoder comprising:
    a processor including a check nodes processor to update check nodes and a variable nodes processor to update variable nodes, the check nodes defining at least two groups of at least two check nodes mutually connected through at least one internal second variable node, each group being connected to a neighboring group by one second variable node defining a connecting second variable node, the check nodes processor implementing a Maximum-A-Posteriori (MAP) type process to jointly update the check nodes of a group; and
    a controller to iteratively activate the processor and during each iteration to activate, for each group, the check nodes processor and the variable nodes processor to jointly update the check nodes of the group, to update the first variable nodes connected to the check nodes of the group and to update each connecting second variable node connected to the group, without updating the internal second variable nodes.

9. The decoder according to claim 8, wherein for each group, the check nodes of the group are respectively connected to different first variable nodes.

10. The decoder according to claim 8, wherein the MAP type process comprises at least one of a LogMAP process and a MaxLogMAP process.

11. The decoder according to claim 8, wherein the processor updates the check nodes and variable nodes with updating messages comprising Log-Likelihood Ratios (LLR).

12. The decoder according to claim 8, wherein the first variable nodes comprise information nodes and the second variable nodes comprise parity nodes.

13. The decoder according to claim 12, wherein the LDPC code comprises an Irregular Repeat-Accumulate (IRA) code.

14. The decoder according to claim 12, wherein the LDPC code comprises at least one of a DVB-S2 LDPC code, a WLAN 802.11n defined code and a WIMAX 802.16e defined code.

15. A data communications component of a communication system comprising at least one of a wireless communication system, a wireline communication system, an xDSL system and an optical fiber system, the data communications component comprising:

a decoder for decoding a Low-Density Parity-Check (LDPC) encoded codeword, the LDPC code being represented by a bipartite graph between check nodes and variable nodes including first variable nodes and second variable nodes of degree two connected to the check nodes via a zigzag connectivity, the decoder including a processor including a check nodes processor to update check nodes and a variable nodes processor to update variable nodes, the check nodes defining at least two groups of at least two check nodes mutually connected through at least one internal second variable node, each group being connected to a neighboring group by one second variable node defining a connecting second variable node, the check nodes processor implementing a Maximum-A-Posteriori (MAP) type process to jointly update the check nodes of a group; and a controller to iteratively activate the processor and during each iteration to activate, for each group, the check nodes processor and the variable nodes processor to jointly update the check nodes of the group, to update the first variable nodes connected to the check nodes of the group and to update each connecting second variable node connected to the group, without updating the internal second variable nodes.

16. The data communications component according to claim 15 wherein the processor updates the check nodes and variable nodes with updating messages comprising Log-Likelihood Ratios (LLR).

17. The data communications component according to claim 15, wherein the first variable nodes comprise information nodes and the second variable nodes comprise parity nodes.

18. The data communications component according to claim 15, wherein the component defines at least one of a terminal, a base station and an access point of a wireless communication system.

* * * * *